(12) United States Patent
Czaplewski-Campbell et al.

(10) Patent No.: US 10,615,095 B1
(45) Date of Patent: Apr. 7, 2020

(54) IMPLEMENTING STRAIN SENSING THERMAL INTERFACE MATERIALS

(71) Applicant: International Business Machines Corporation, Armonk, NY (US)

(72) Inventors: Sarah K. Czaplewski-Campbell, Rochester, MN (US); Timothy Tofil, Rochester, MN (US); Eric J. Campbell, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/175,666

(22) Filed: Oct. 30, 2018

(51) Int. Cl.
| | | |
|---|---|---|
| H01L 23/373 | (2006.01) | |
| H01L 21/48 | (2006.01) | |
| G01L 1/22 | (2006.01) | |

(52) U.S. Cl.
CPC ........ H01L 23/3733 (2013.01); G01L 1/2287 (2013.01); H01L 21/4871 (2013.01)

(58) Field of Classification Search
CPC ............. H01L 23/3733; H01L 21/4871; G01L 1/2287
See application file for complete search history.

(56) References Cited

U.S. PATENT DOCUMENTS

| | | | |
|---|---|---|---|
| 7,396,569 B2 | 7/2008 | Lalli et al. | |
| 7,730,547 B2 | 6/2010 | Barrera et al. | |
| 8,404,209 B2 | 3/2013 | Moravsky et al. | |
| 8,726,741 B2 | 5/2014 | Krippner et al. | |
| 9,631,989 B1 | 4/2017 | Asiri et al. | |
| 2007/0222472 A1 | 9/2007 | Raravikar et al. | |
| 2008/0131722 A1* | 6/2008 | Suhir | B32B 15/04 428/616 |
| 2009/0015278 A1 | 1/2009 | Dang et al. | |
| 2013/0264041 A1 | 10/2013 | Zhamu et al. | |
| 2016/0023906 A1 | 1/2016 | Harutyunyan et al. | |
| 2019/0143275 A1* | 5/2019 | Arnusch | C02F 1/4674 210/636 |
| 2019/0292675 A1* | 9/2019 | Lin | C08J 7/045 |
| 2019/0292721 A1* | 9/2019 | Lin | D06M 10/06 |
| 2019/0292722 A1* | 9/2019 | Lin | C03C 25/44 |
| 2019/0319119 A1* | 10/2019 | Li | H01L 29/42392 |
| 2019/0319262 A1* | 10/2019 | Zhamu | H01M 4/624 |
| 2019/0326113 A1* | 10/2019 | Jang | H01L 29/24 |

(Continued)

OTHER PUBLICATIONS

K.M.F. Shahil and A.A. Balandin, "Graphene based nanocomposites as highly efficient TIMs", Graphene Based Thermal Interface Materials, 2011.

(Continued)

*Primary Examiner* — Nathan W Ha
(74) *Attorney, Agent, or Firm* — Kelsey M. Skodje

(57) ABSTRACT

Methods and structures are provided for implementing strain sensing thermal interface materials (TIMs). An in situ strain sensing thermal interface material (TIM) layer is provided within a packaging assembly structure. The strain sensing TIM is formed by graphene incorporated into the TIM layer. Electrical leads are coupled to the strain sensing TIM layer providing electrical contacts for measuring the electrical property change of the TIM which correlates to mechanical strain.

20 Claims, 3 Drawing Sheets

(56) References Cited

U.S. PATENT DOCUMENTS

2019/0341199 A1* 11/2019 Kang .................... H01G 11/36

OTHER PUBLICATIONS

Vivek Goyal and Alexander A. Balandin, "Thermal properties of hybride graphene-metal composites", Nano-Device Laboratory, Department of Electrical Engineering and Materials Science and Engineering Program, University of California, Riverside, California 92521 USA.

Borland et al., "Sensitive electromechanical sensors using viscoelastic graphene-polymer nanocomposites" in Science 354 (6317), sciencemag.org, Dec. 9, 2018, pp. 1257-1260.

Borland et al., "Supplemental Material for Sensitive electromechanical sensors using viscoelastic graphene-polymer nanocomposites" in Science 354 (1257), sciencemag.org, Dec. 9, 2018, pp. 1257-1260.

* cited by examiner

IMPLEMENTING STRAIN SENSING THERMAL INTERFACE MATERIALS

FIELD OF THE INVENTION

The present disclosure relates generally to thermal interface materials (TIMs), and more particularly, relates to methods and structures for implementing strain sensing thermal interface materials (TIMs) used in data processing field.

BACKGROUND

Thermal interface materials (TIMs) are used extensively to improve thermal conduction across two mating parts.

In situ strain gauges would be useful in thermal interface materials (TIMs) that are used within microprocessor and server packaging.

For example, putty and grease TIMs, often used between a module and heatsink, have a propensity to pump-out with thermal cycling. This material pump-out reduces heat transfer away from the module and overall performance. Therefore, it would be beneficial to monitor pump-out over time in the field or during qualification testing.

SUMMARY

Principal aspects of the present disclosure are to provide methods and structures for implementing strain sensing thermal interface materials (TIMs). Other important aspects of the present disclosure are to provide such methods and structures substantially without negative effects and that overcome many of the disadvantages of prior art arrangements.

In brief, methods and structures are provided for implementing strain sensing thermal interface materials (TIMs). An in situ strain sensing thermal interface materials (TIM) layer is provided within a packaging assembly structure. The strain sensing TIM is formed by graphene incorporated into the TIM layer. Electrical leads are coupled to the strain sensing TIM layer providing electrical contacts for measuring the electrical property change of the TIM which correlates to mechanical strain.

In accordance with features of the disclosure, incorporating graphene in TIMs enables the user to monitor the strain in real time which is especially useful during qualification testing of new parts to characterize expected TIM performance.

In accordance with features of the disclosure, the strain sensing TIM includes electrical conductors, optionally an electrically conductive mesh formed of a selected material from a group including copper, copper plated with nickel, coupled to the strain gauge provided with the thermal interface materials (TIM) layer.

BRIEF DESCRIPTION OF THE DRAWINGS

The present disclosure together with the above and other objects and advantages may best be understood from the following detailed description of the preferred embodiments of the disclosure illustrated in the drawings, wherein.

DETAILED DESCRIPTION OF THE PREFERRED EMBODIMENTS

In the following detailed description of embodiments of the disclosure, reference is made to the accompanying drawings, which illustrate example embodiments by which the disclosure may be practiced. It is to be understood that other embodiments may be utilized and structural changes may be made without departing from the scope of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the disclosure, methods and structures are provided for implementing in situ strain sensing thermal interface materials (TIMs). The thermal interface materials (TIMs) of an illustrative embodiment contain graphene which render the TIM electrically conductive while maintaining the viscoelastic properties of the TIM in the packaging structure.

A thermal interface material (TIM) describes any material that is inserted between two parts in order to enhance the thermal coupling between these two components. For heat dissipation, the TIM is inserted between a heat source or heat producing device and a heat sink or heat dissipation device. Thermal interface materials (TIMs) include thermal grease, putty, and adhesive.

In accordance with features of the disclosure, incorporation of graphene nanosheets into a TIM is provided in order to create an in situ strain gauge. Graphene nanosheets are blended into a silicone based TIM or other viscoelastic TIM forming an in situ strain gauge for use in packaging assemblies to monitor strain in situ. Strain measurements are used in the field, for example, to determine if TIM pump-out is occurring and if the TIM layer should be replaced.

Figure 1:
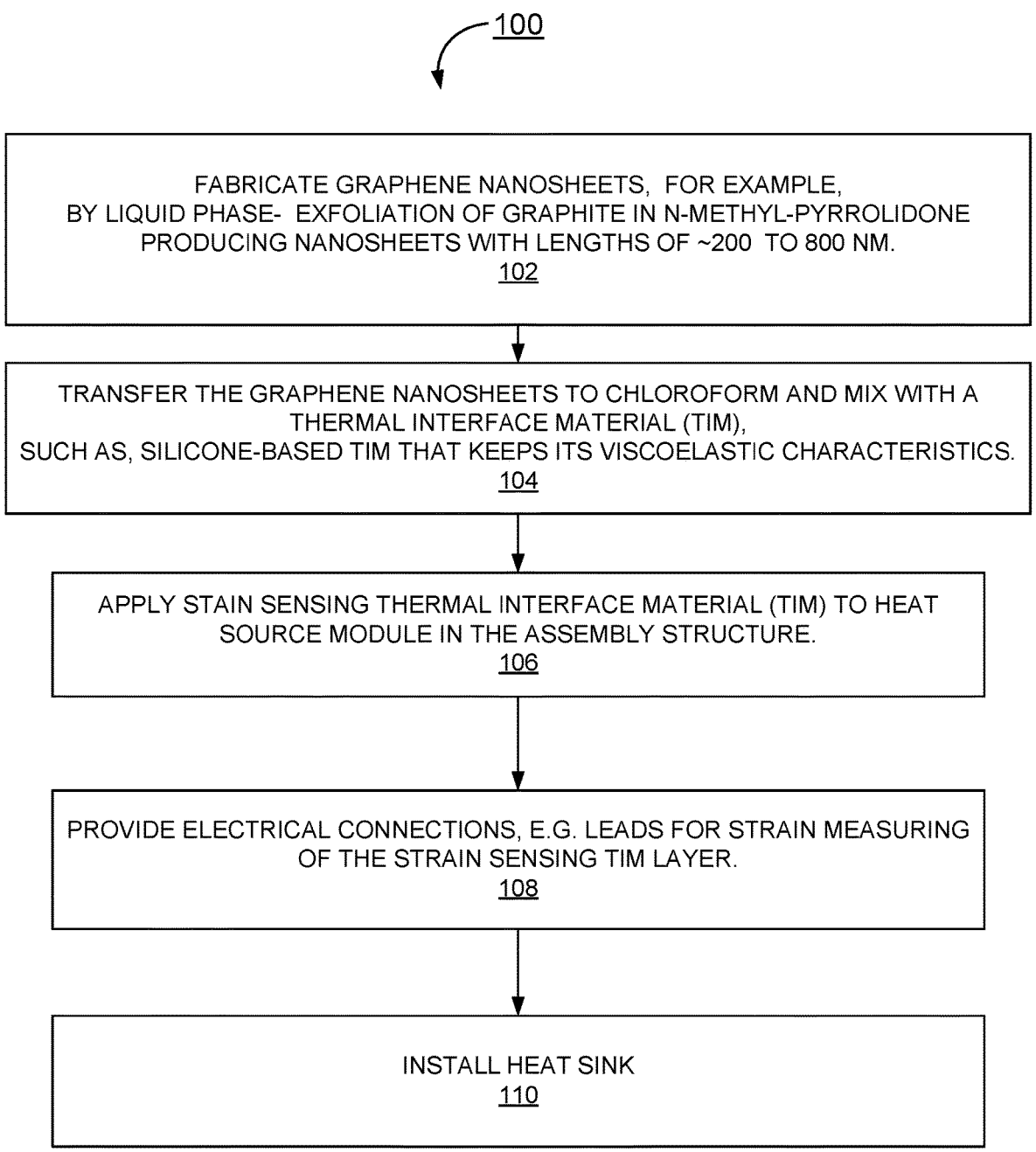
FIG. 1 is a flow chart illustrating example steps for implementing in situ strain sensing thermal interface materials (TIMs) in accordance with an illustrative embodiment.
Figure 2:
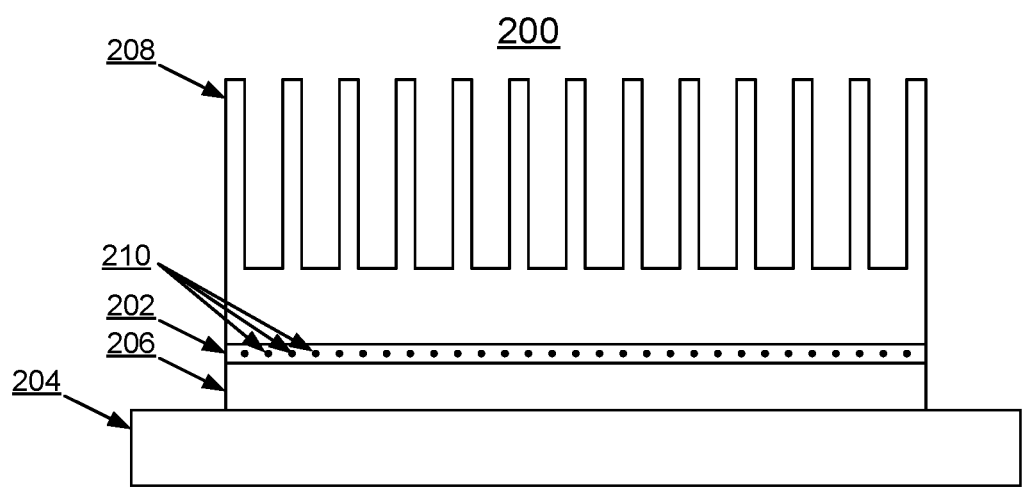
FIG. 2 is a side view not to scale schematically illustrating an example structure including an in situ strain sensing thermal interface material (TIM) in accordance with an illustrative embodiment.
Figure 3:
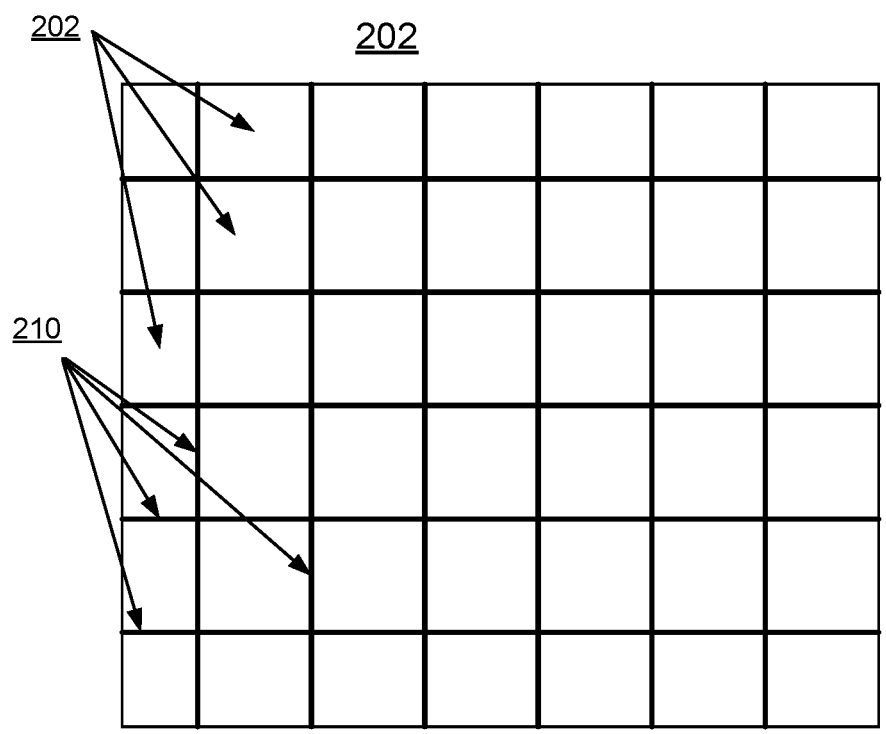
FIG. 3 is a top down planar view not to scale schematically illustrating the strain gauge thermal interface material (TIM) together with example electrical contacts in accordance with an illustrative embodiment.

Referring now to FIG. 1, there is shown a flow chart illustrating example steps for implementing strain sensing thermal interface materials (TIMs) generally designated by the reference character 100 in accordance with a preferred embodiment. Referring also to FIGS. 2 and 3, there are shown an example structure including in situ strain sensing thermal interface material (TIM) layer in accordance with preferred embodiments.

Referring to FIG. 2, there is shown a side view not to scale schematically illustrating an example structure generally designated by the reference character 200 including an in situ strain sensing layer thermal interface material (TIM) layer 202 in accordance with a preferred embodiment. Structure 200 includes a printed circuit board (PCB) 204 carrying a heat source module 206. The in situ strain sensing layer thermal interface material (TIM) layer 202 is applied to the heat source module 206. Structure 200 includes a heat sink 208 with the in situ strain sensing layer thermal interface materials (TIMs) layer 202 extending between the heat source module 206 and the heat sink 208. Electrical wires 210 are provided in the in situ strain gauge TIM layer 202 for providing the electrical contacts for measuring the electrical property change of the TIM which correlates to mechanical strain.

In FIG. 1, as indicated at a block 102, graphene nanosheets are formed for use in a thermal interface material (TIM) layer 202 shown in FIGS. 2 and 3. At block 102, graphene nanosheets are formed by liquid phase exfoliation of graphite, for example, in n-methyl-pyrrolidone producing nanosheets with lengths of –200 nm to 800 nm. Graphene can be prepared as generally described by the publication entitled "Sensitive electromechanical sensors using viscoelastic graphene-polymer nanocomposites" by Boland et al., in Science 354 (6317), sciencemag.org, 9 Dec. 2018, pps. 1257-1260. Then, as indicated at a block 104, the graphene nanosheets are transferred to chloroform or (other suitable solvent) and mixed with a viscoelastic, for example, silicone-based TIM that keeps its viscoelastic characteristics in accordance with a preferred embodiment.

As indicated at a block 106, the strain sensing TIM is applied to a heat source module in the assembly structure, forming the in situ strain sensing thermal interface material (TIM) layer 202 shown in FIG. 2.

As indicated at a block 108, electrical leads are coupled to the in situ strain sensing thermal interface material (TIM) layer 202 providing electrical contacts for measuring the electrical property change of the strain sensing TIM which correlates to mechanical strain. The electrical leads include, for example, isolated conductors in a wire mesh with the wire conductors or electrically conductive mesh providing electrical contacts for the strain sensing TIM. Example electrical lead wires 210 are illustrated in FIGS. 2 and 3 including, for example, isolated conductors or an electrically conductive mesh 210, for example, formed of a selected material including copper, copper plated with nickel, and aluminum.

In accordance with features of the disclosure, the strain sensing TIM layer 202 includes the wire mesh of embedded wires 210 in the TIM layer 202 to provide the electrical contacts. These wire leads 210 optionally are embedded into the TIM and attached on the heat sink 208. By forming a wire array 210, as best shown in FIG. 3, strain at multiple points on the strain sensing TIM layer 202 in the assembly structure 200 can be monitored and corrective action taken prior to excessive pump out or failure of the TIM layer 202. The strain monitoring techniques can be employed not only in the field, but also as a valuable qualification tool.

As indicated at a block 106, a strain sensing thermal interface material (TIM) layer 202 is applied to a heat source module 206 as shown in the assembly structure 200. Electrical connections 210, for example, leads for strain monitoring of the strain sensing TIM layer 202 are attached as indicated at a block 108. Finally a heat sink or heat spreader 208 or other similar heat transfer device 208 is installed in the assembly structure 200 as indicated at a block 110.

In accordance with features of the disclosure, in an embodiment of the disclosure forming the electrical leads for strain monitoring includes embedding an electrical wire mesh 210 within the strain gauge TIM layer 202, as shown in FIGS. 2 and 3.

While the present disclosure has been described with reference to the details of the embodiments of the disclosure shown in the drawing, these details are not intended to limit the scope of the disclosure as claimed in the appended claims.

What is claimed is:

1. A packaging structure for implementing strain gauge thermal interface materials (TIMs) comprising:
    an in situ strain sensing thermal interface material (TIM) layer in the packaging structure;
    graphene incorporated into the TIM layer providing the strain sensing capability for measuring strain on the strain sensing TIM layer, and
    electrical leads coupled to the strain sensing TIM layer providing electrical contacts for measuring strain.

2. The structure as recited in claim 1, wherein the thermal interface material (TIM) has predefined viscoelastic properties.

3. The structure as recited in claim 2, wherein the thermal interface material (TIM) maintains the viscoelastic properties in the packaging structure.

4. The structure as recited in claim 1, wherein the strain sensing TIM is electrically conductive.

5. The structure as recited in claim 1, wherein the graphene changes the electromechanical properties of the thermal interface material (TIM).

6. The structure as recited in claim 1, wherein the strain sensing TIM layer is formed by incorporating graphene nanosheets prepared by processing liquid phase-exfoliation of graphite producing nanosheets in to the TIM.

7. The structure as recited in claim 6, wherein the nanosheets having lengths in a range of approximately 200 nm to 800 nm.

8. The structure as recited in claim 1, wherein the packaging structure includes the in situ strain sensing thermal interface material (TIM) layer disposed between a heat source module and a heat sink.

9. The structure as recited in claim 8, wherein the in situ strain sensing thermal interface material (TIM) layer enables detecting when the TIM layer should be replaced.

10. The structure as recited in claim 1, wherein the situ strain sensing thermal interface material (TIM) layer incorporates graphene nanosheets.

11. A method for implementing strain sensing thermal interface materials (TIMs) comprising:
    providing an in situ strain sensing thermal interface material (TIM) in a packaging structure;
    enabling strain sensing capability by blending graphene into the thermal interface material (TIM); and
    providing electrical leads coupled to a TIM layer for measuring electrical property change of the TIM cause by mechanical deformation.

12. The method as recited in claim 11, wherein enabling strain sensing capability in the strain sensing TIM includes blending graphene nanosheets into the TIM.

13. The method as recited in claim 11, wherein providing an in situ strain sensing thermal interface material (TIM) in a packaging structure includes providing a thermal interface material (TIM) having predefined viscoelastic properties.

14. The method as recited in claim 11, wherein the thermal interface material (TIM) maintains the viscoelastic properties assembled within the packaging structure.

15. The method as recited in claim 11, wherein the strain sensing thermal interface material (TIM) is electrically conductive.

16. The method as recited in claim 15, further comprising:
    using the in situ strain sensing thermal interface material (TIM) layer for detecting when the TIM layer should be replaced.

17. The method as recited in claim 11, wherein graphene nanosheets are prepared by processing liquid phase exfoliation of graphite producing graphene nanosheets.

18. The method as recited in claim 11, wherein providing electrical leads coupled to the TIM layer for forming electrical contacts for measuring strain includes embedding electrical leads into the TIM layer providing electrical contacts for the measuring strain.

19. The method as recited in claim 11, wherein embedding electrical leads into the TIM layer includes embedding a wire array into the TIM layer attached to a heat sink.

20. The method as recited in claim 11, includes disposing the in situ strain sensing thermal interface material (TIM) layer between a heat source module and a heat sink.

* * * * *